United States Patent [19]

Frenklach et al.

[11] Patent Number: 5,087,434
[45] Date of Patent: Feb. 11, 1992

[54] SYNTHESIS OF DIAMOND POWDERS IN THE GAS PHASE

[75] Inventors: Michael Y. Frenklach; Karl E. Spear; Richard J. Koba, all of State College, Pa.

[73] Assignee: The Pennsylvania Research Corporation, University Park, Pa.

[21] Appl. No.: 341,650

[22] Filed: Apr. 21, 1989

[51] Int. Cl.$^5$ ............................................. B01S 30/06
[52] U.S. Cl. ........................... 423/446; 156/DIG. 68; 427/39
[58] Field of Search ............... 423/446; 156/DIG. 68; 204/173; 501/86; 427/39

[56] References Cited

U.S. PATENT DOCUMENTS

| | | | |
|---|---|---|---|
| 3,661,526 | 5/1972 | Angus et al. | 156/DIG. 68 |
| 3,714,334 | 1/1973 | Vickery | 423/446 |
| 4,228,142 | 10/1980 | Holcombe, Jr. et al. | 423/449 |
| 4,434,188 | 2/1984 | Kamo et al. | 423/446 |
| 4,485,080 | 11/1984 | Shingu et al. | 423/446 |
| 4,504,519 | 3/1985 | Zelez | 423/446 |
| 4,740,263 | 4/1988 | Imai et al. | 156/DIG. 68 |
| 4,767,608 | 8/1988 | Matsumoto et al. | 423/446 |
| 4,816,286 | 3/1989 | Hirose | 427/39 |

FOREIGN PATENT DOCUMENTS

| | | | |
|---|---|---|---|
| 58-110494 | 7/1983 | Japan | 423/446 |
| 61-158898 | 7/1986 | Japan | 423/446 |
| 62-171995 | 7/1987 | Japan | 423/446 |
| 62-223095 | 10/1987 | Japan | 423/446 |
| 63-256596 | 10/1988 | Japan | 156/DIG. 68 |

OTHER PUBLICATIONS

Popov et al., Formation of Metastable Phases of Carbon in High-Temperature Plasma, Proc. Acad. Sci. U.S.S.R. 49:546 (1987).

Popov et al., Change in the Composition of the Solid Phase During the Sudden Cooling of Products of the Homogeneous Condensation of Carbon, Colloidal Journal of the U.S.S.R. 49:546 (1987).

Primary Examiner—Robert Kunemund
Attorney, Agent, or Firm—Thomas J. Monahan

[57] ABSTRACT

Compositions of synthetic diamond particles and their synthesis by homogeneous nucleation of seed particles in the gas phase followed by growth of diamond or diamond-like carbon on these seeds is disclosed. These particles are characterized by their controlled size, shape, purity, surface characteristics, and their electrical properties and crystal structure.

8 Claims, 5 Drawing Sheets

SYNTHESIS OF DIAMOND POWDERS IN THE GAS PHASE

BACKGROUND OF THE INVENTION

1. Field of the Invention

The present invention relates to compositions and structures of a new class of synthetic diamond and diamond-like particles and the novel methods for producing such particles. The invention enables the manufacturer to tailor the properties of the diamond particles, including particle composition, size, size distribution, shape, crystalline structure, surface properties and electrical resistivity.

As used in regard to the present invention, the term "diamond" encompasses the cubic and all hexagonal polytypes of crystalline $sp^3$ carbon. The term "diamond-like" includes all carbon structures with short range order containing primarily $sp^3$ bonded carbon.

2. Discussion of Background

There are currently no available methods for mass-producing diamond powder with high purity or controlled purity. Most commercially available diamond powder contains a high concentration of impurities which are either dissolved within the crystalline lattice or are second phase inclusions. Industrial grade, natural diamond powder is characterized by containing both types of impurities wherein the second phase inclusions are naturally occuring minerals and the dissolved impurity is usually nitrogen. Industrial grade, natural diamond powder is yellow in color due to the dissolved nitrogen and is classified type Ia. There are two additional classes of natural diamond, type IIa and type IIb. Type IIa diamond is extremely pure, colorless, and gem quality; type IIb diamond is boron-doped, blue in color and also of gem quality. Powder composed of type IIa or type IIb diamond is unsuitable for industrial applications because of their great cost.

There are two conventional methods presently used for producing synthetic diamond:

Diamond grit is synthesized by precipitation from a carbon plus metal solvent/catalyst solution at high temperatures (e.g. 2000° C.) and high pressures (e.g. 30 kbar). This high temperature/high pressure (HT/HP) diamond can be free of second phase inclusions, but almost always contains significant concentrations of dissolved nitrogen and the metal solvent/catalyst. Typical solvent/catalyst metals include alloys of nickel, iron, and cobalt. The nitrogen content of this HT/HP yellow diamond classifies it as type Ib.

Diamond powder is also mass produced by shock wave synthesis in which an explosive charge shocks a mixture of carbon and a metal solvent/catalyst. The shock-produced diamond is typically contaminated with dissolved nitrogen and metal, usually iron. Elaborate chemical processing is required to recover the diamond particles from the surrounding graphite and metal within the reaction chamber.

Diamond powder can also be made by precipitation of diamond within certain amorphous metals which are saturated with carbon. Shingu et al. U.S. Pat. No. 4,485,080 describe a two step process for the rapid solidification of carbon-containing metal alloys, followed by the precipitation of diamond particles inside the amorphous metal at temperatures above 100° C. The diamond must be recovered from the metal by acid digestion. Such diamond particles are probably highly impure.

All industrial methods for diamond powder synthesis require extraction of the diamond particles from their metal matrix, followed by comminution and sizing of the particles into the desired size ranges. The cost per gram of grading industrial diamond into size categories usually exceeds the cost of synthesizing the diamond grit by a factor of approximately four.

More recently, a third method of diamond synthesis has been introduced, namely, the deposition of diamond thin films from the gas phase by activated chemical vapor deposition (CVD). In most instances of diamond CVD, diamond particles nucleate on a surface (heterogeneously) and then the particles grow in size. The particles may be widely separated or may be close enough to coalesce into a continuous diamond film.

Previous research has reported that the nucleation of isolated diamond grains on specially prepared substrates may be controlled within certain parameters. However, the heterogeneous nucleation of diamond particles has two drawbacks as a method for diamond particle synthesis:

(a) The diamond particle will be contaminated by the substrate. If the goal is to synthesize high purity diamond, then a diamond substrate would be required for heterogeneous nucleation. If a diamond substrate were employed, however, the diamond particle would be tightly bonded to their substrate thereby making it difficult to collect the particles.

(b) The isolated diamond grains must be separated from their substrate. If the diamond particles are below 1 μm in diameter, the isolation and extraction procedure becomes as cumbersome as the procedure currently employed to isolate synthetic diamond particles from their parent metal/solvent catalyst.

One example of deposition on a surface followed by particle extraction has been reported by Banks in U.S. Pat. No. 4,495,044. This patent describes the formation of "diamond-like flakes" by arc evaporation of graphite onto a vertical substrate. The evaporated carbon attains diamond-like structure by simultaneous bombardment of the substrate by an argon ion beam. The diamond-like film grows on the substrate until it attains a thickness resulting in excessive film stress causing the film to disintegrate into flakes which then fall into a collection bin. This method does not permit control of the size, shape, or chemical composition of the diamond flake. It is also to be expected that the flakes are probably chemically contaminated by material from the substrate. For these reasons, therefore, no disclosure is contained for the synthesis of true, crystalline diamond.

Holcombe, Jr. et al. (U.S. Pat. No. 4,228,142) claims methods for depositing "metastable carbon" (including diamond and diamond-like carbon) onto silicon carbide (SiC) particles by the pyrolysis of $CF_4$. Specifically, the patent discusses a two-step procedure in which SiC particles are deposited onto a surface by the thermal decomposition of various gases, followed by the decomposition (plasma may be utilized to affect gas decomposition) of $CF_4$ onto the surfaces of the SiC particles. Although the inventors disclose the use of catalyst metals (such as iron) as a preferred method of promoting the deposition of diamond and diamond-like phases onto the SiC particles, as well as the deposition of metastable carbon onto SiC particles in a fluidized bed, they do not disclose homogeneous nucleation of the SiC seeds, nor the sequential use of such SiC particles as seeds for diamond growth in a flowing gas stream.

All of the aforementioned methods of diamond particle synthesis suffer from: (a) the inability to create high purity, crystalline diamond, (b) the inability to controllably dope the diamond particles, and (c) the inability to directly synthesize particles of a desired size or size distribution, e.g. monosized particles.

A number of researchers have claimed to produce diamond in the gas phase. Most of them do not provide clear evidence that the diamond powder was homogeneously nucleated; in most cases, diamond particles were nucleated on surfaces. Recent publications by Soviet researchers present results indicating homogeneous nucleation of diamond powder, viz., V. T. Popov, et al., Colloid J. USSR, 49, 546(1987) and V. T. Popov, et al., Proc. Acad. Sci USSR Phys. Chem. Sect. 296, 923(1987). The Soviet researchers reported the formation of diamond powder in acetylene pyrolysis, after the products of thermal pyrolysis were quenched either by injection of water or by expansion of the gas in nozzle. Plasma oxidation of the material formed in the experiments resulted in a mixture of diamond and lonsdaleite particles about 20 nm in diameter. The Soviet authors did not provide details about the pyrolysis conditions.

Matsumoto et al. (U.S. Pat. No. 4,767,608) discloses methods for producing diamond thin films as well as diamond powders. Diamond powder formation results when a substrate is not present inside the reaction chamber. The patent describes the production of diamond powder in a plasma reactor by using suitable hydrocarbon-hydrogen-inert gas mixtures. Diamond powder homogeneously precipitates because of the adiabatic expansion of certain gases through an orifice into a plasma excitation zone. The patent does not, however, describe any methods to separately control the nucleation step and growth step for synthesizing diamond particles, nor does it consider the homogeneous precipitation of non-diamond seeds which promote the deposition of diamond to larger particle diameters. Furthermore, the patent does not contemplate methods to control the size, purity and crystal structure of the diamond particles.

SUMMARY OF THE INVENTION

Unique materials are produced in accordance with the present invention. Diamond and diamond-like particles can be created which are single phase, or composed of two or more concentric phases wherein at least one phase is diamond or diamond-like carbon.

The present invention is intended to overcome the drawbacks and limitations of the prior art methods for diamond particle synthesis. The current invention describes novel methods for producing diamond particles in the gas phase whose size and purity can be controlled. The invention also covers the creation of multiphase particles composed of diamond encapsulating a nucleus other than diamond.

Key to this invention is the recognition that particle nucleation and growth are distinct phenomena which can occur in the same reaction zone or in separate reaction zones. Nucleation of particles can occur in an environment which is chemically dissimilar to the diamond growth environment. The gas activation process of the nucleation and growth stages may be different as well. The seeds may be a material other than diamond, such as a carbide, but the predominant phase in each particle is crystalline diamond or diamond-like carbon. The bulk crystalline diamond can be pure, or controllably doped (substitutionally or interstitially) with elements such as boron, silicon, and/or titanium. Doping of the diamond particles enhances the utility of the particles for various applications, for example, boron doping of diamond usually renders diamond a p-type semiconductor whose electrical resistivity can be controlled by the amount of boron incorporation.

This present invention teaches processes which have been demonstrated to homogeneously nucleate $sp^3$ carbon phases, viz., diamond, which is crystalline, and diamond-like carbon (DLC), which is non-crystalline, as well as particles containing both crystalline and non-crystalline phases. Cubic (3C) diamond as well as hexagonal diamond, including the hexagonal polytypes of 6H and 2H diamond (lonsdaleite), have been synthesized utilizing the method according to the present invention.

The method, according to the present invention, employs a continuous flow process whereby carbon-containing gases and dopant source gases are mixed with hydrogen, oxygen, and/or an inert gas and introduced in a continuous, preferably tubular, flow reactor. The gas mixture is activated in some way to homogeneously precipitate seeds, followed by deposition of diamond on the seeds. To affect homogeneous nucleation, the gases are activated by electromagnetic and/or thermal energy sources, such as a DC plasma. RF plasma, microwave plasma, combustion, plasma assisted combustion, hot thermionic material, or combinations thereof. Laser light radiation may also be used to affect homogeneous nucleation. To affect growth of diamond on the seeds, the same (or a separate set of) gases are activated by electromagnetic and/or thermal energy sources, such as DC plasma, RF plasma, microwave plasma, plasma assisted combustion, hot thermionic material, laser radiation, or combinations thereof.

The present invention includes compositions of diamond particles of controlled size, purity and crystal structure, and methods for producing such particles. The diamond particles are created by homogeneous nucleation of seed particles from the gas phase, followed by growth of diamond or diamond-like carbon on these seeds. The particles may be single phase diamond or diamond-like carbon, or the particles may be composed of several concentric phases, at least one of which is diamond or diamond-like carbon. The nucleation and growth steps may occur sequentially in a single stage reactor, or in multiple activation stages which the particles encounter as they are transported in a gas stream. More particularly, the present invention comprises:

(a) The homogeneous precipitation of seeds which support the growth of diamond and diamond-like carbon. The seeds can be a variety of materials including silicon carbide, boron carbide, pure or doped diamond-like carbon, pure or doped diamond. The seeds can be precipitated by activating various gas mixtures by electromagnetic and/or thermal energy. Seeds are typically below 50 nm in diameter, and are typically non-agglomerated.

(b) The growth of diamond on the seeds as they are transported via a flowing gas stream through a reaction zone. Diamond and diamond-like carbon can be deposited onto the seeds by activating various gas mixtures by electromagnetic and/or thermal energy. The diamond particles can be grown to any desired size ranging from the seeds diameter to over 1 μm. The invention enables the ability to tailor the properties of the diamond particles, including particle composition, size, size distribution, shape, crystalline structure, surface properties and electrical resistivity.

(c) The particles synthesized by the nucleation and growth methods described in (a) and (b).

A further understanding of these and other aspects of the present invention may be had by reference to the following examples and drawings in which:

FIG. 2 is a schematic diagram of a multi-phase particle composed of concentric phases, one of which is diamond or diamond-like.

DETAILED DESCRIPTION OF THE INVENTION

Figure 1:
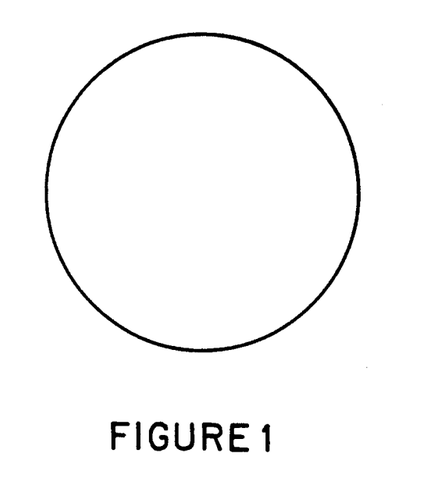
FIG. 1 is a schematic diagram of a single phase, diamond or diamond-like particle.
Figure 2:
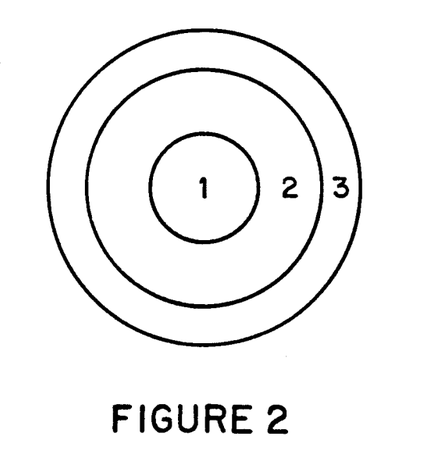

As depicted in FIGS. 1 and 2, the present invention can create both single phase or multi-phase particles. Single phase particles are illustrated in FIG. 1, in which both the seed and the surrounding material have identical composition and structure; both are diamond or diamond-like. The present invention also allows for creating unique multi-phase particles as illustrated in FIG. 2. A multi phase particle is composed of a nucleus 1 surrounded by one or more phases 2 and 3 which include diamond or diamond-like carbon. Because particle nucleation and growth both occur in the gas phase, this invention is unique in that it creates particles composed of multiple phases arranged concentrically. All points on the surface of the particle receive equal deposition rates, so all the concentric phases have approximately equal thickness over the surface of the particle. Seeds resting on a surface would not experience concentric diamond deposition since no diamond would be deposited at the point where the particle touches its substrate. Multi-phase diamond particles grown while resting on a surface can be distinguished from the particles of this invention by determining the spatial distribution of the phases within each particle by analytical electron microscopy coupled with electron/X-ray spectroscopies.

Figure 3:
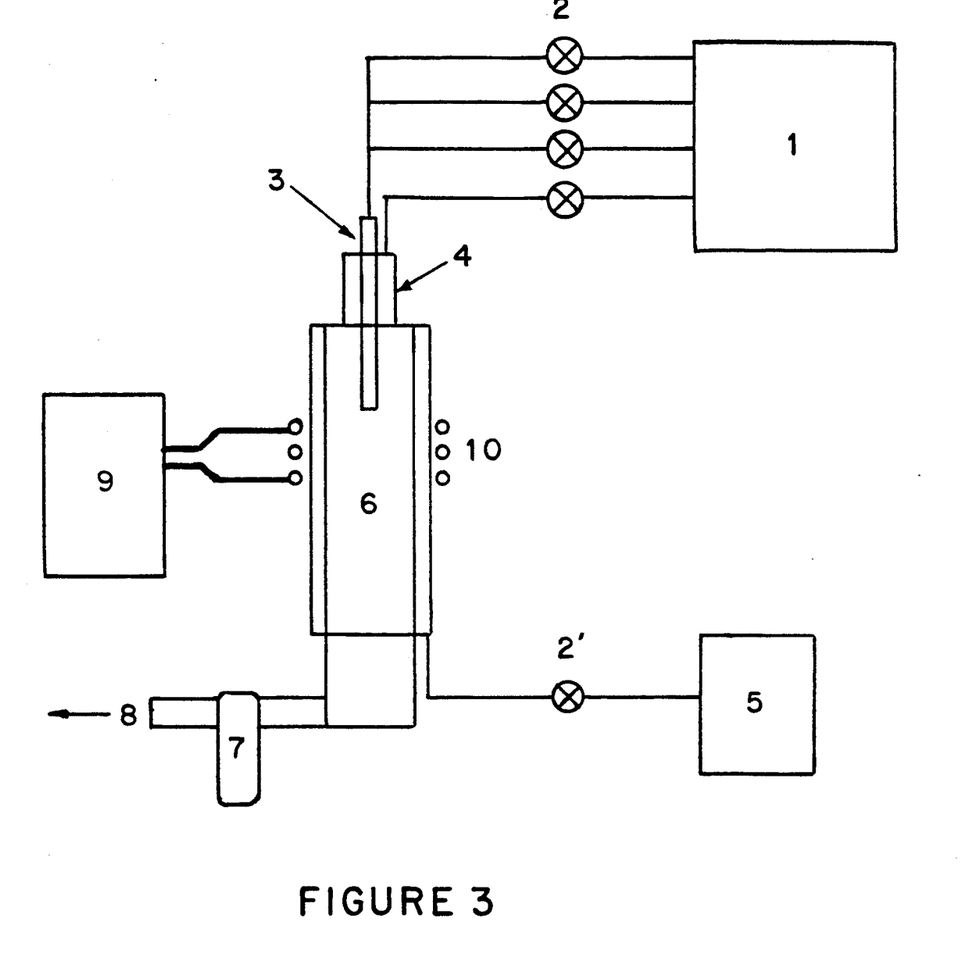
FIG. 3 is a view illustrating an apparatus whereby diamond particles can nucleate and/or grow in a plasma generated by RF inductive coupling.

FIG. 3 shows a diagrammatic view of the apparatus for nucleation and/or growth of diamond particles by RF inductively coupled plasma activation. Process gases 1 are metered by mass flow controllers 2 into a gas injection lance 3. Gases are injected through one or more tubes, "lances", whose position above plasma excitation zone can be controlled at will. The lance can either be used to introduce gases into a plasma zone, and/or the lance can serve as a burner for gas combustion. The end of the lance may be a simple hole or a special nozzle to promote expansion of the gas. The lance orifice may be inserted either inside the plasma excitation zone or slightly above it. If a shroud gas is employed, the shroud gas must be injected outside the lance, coaxial with the lance. The design of the lance may incorporate features to enhance the combustion flame stability, prevent flashback, and enhance the expansion of the fuel +oxygen mixture into the reactor. The fuel +oxygen mixture may be either premixed upstream from the lance or mixed inside the lance. The fuel +oxygen injection manifold must be fitted with flashback arresters to prevent catastrophic flashback.

Gases are introduced into the injection lance or nozzle at a higher pressure than is maintained in the reaction chamber. The actual combustion plasma chamber may be maintained at a vacuum or atmospheric pressure. The lower the pressure, the lower the precipitation rate of diamond. The higher pressure, the greater the output of diamond powder. Lower pressure makes it easier to form and maintain a plasma via electromagnetic excitation. Higher pressures produce a greater output of solid carbon, but make it more difficult to sustain a plasma, especially a microwave plasma. The process gases are surrounded by a concentric shroud gas injected at 4. If hot, reactive gases contact the silica walls of the reaction chamber, graphite tends to be deposited at a fast rate, and the gas shroud can be used to form a curtain between the hot, reactive combustion/plasma zone and the cooled, fused silica walls, as illustrated in FIGS. 3-6. If graphite is deposited on the silica walls, the graphite will couple any applied RF or microwave field, become excessively hot and will eventually melt a portion of the silica tube. Therefore, the chemical reaction zone should be coaxial with, and completely enveloped by a gas curtain. For the nucleation and growth of diamond or diamond-like carbon particles, the gas curtain can be an inert gas, hydrogen, or oxygen or mixtures thereof. A coolant gas such as nitrogen 5 is metered by a valve 2' and passed along the outside of the reaction chamber 6. The double walls of chamber 6 must be transparent to RF fields. Particles formed in the gas phase are extracted from the effluent gas by a particle filter 7 which leads to a vacuum pump connected to 8. An RF power supply 9 is connected to water-cooled induction coils 10 which create plasma excitation of the gases in chamber 6. The preferred frequency of RF excitation is 13.56 MHz.

Figure 4:
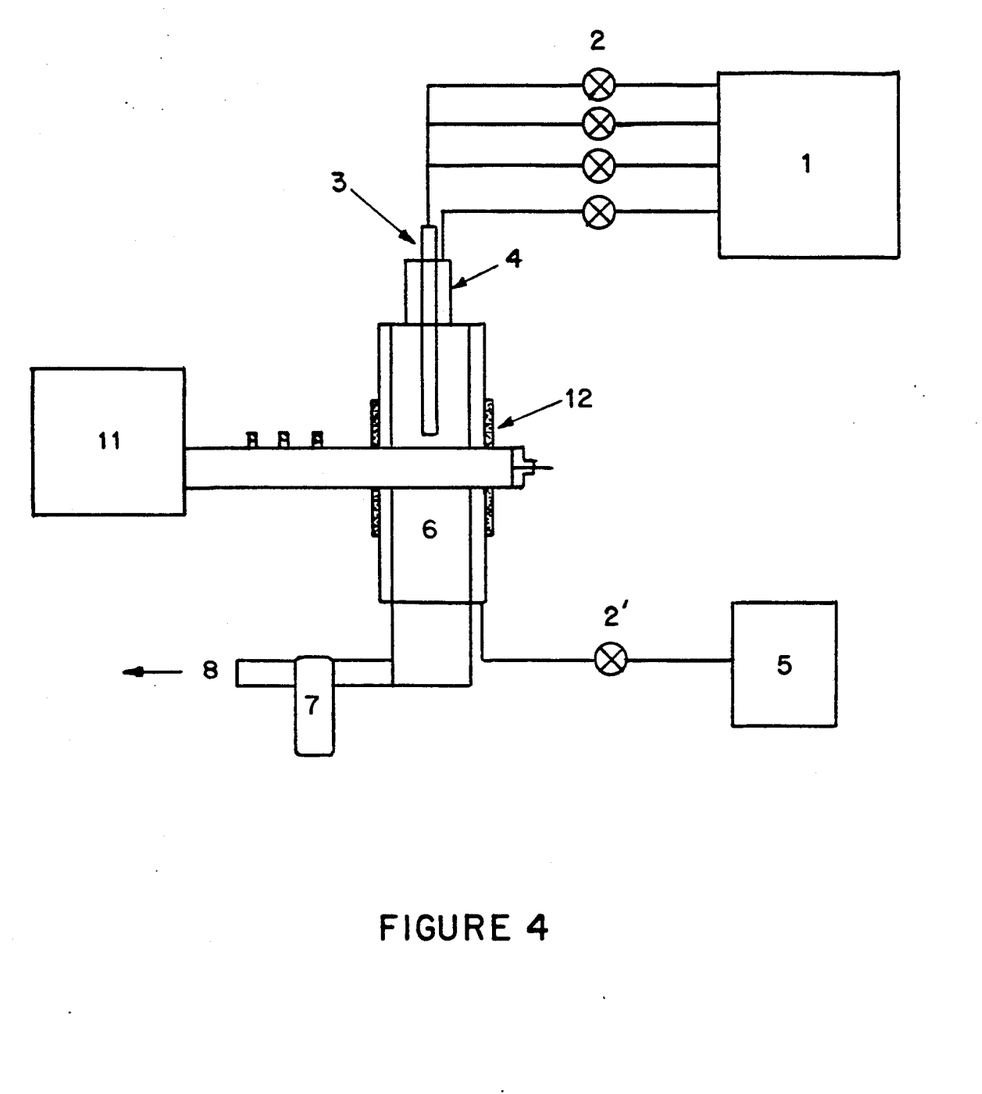
FIG. 4 is a view illustrating an apparatus whereby diamond particles can nucleate and/or grow in a plasma generated by microwave coupling.

FIG. 4 shows a diagrammatic view of the apparatus for nucleation and/or growth of diamond particles by microwave coupled plasma activation. Process gases 1 are metered by mass flow controllers 2 into a gas injection lance 3. The process gases are surrounded by a concentric shroud gas injected at 4. A coolant gas such as nitrogen 5 is metered by a valve 2' and passed along the outside of the reaction chamber 6. The double walls of chamber 6 must be transparent to microwave fields. Particles formed in the gas phase are extracted from the effluent gas by a particle filter 7 which leads to a vacuum pump connected to 8. A microwave power supply 11 launches microwaves which are focused into the reaction chamber 6 by a microwave applicator 12. A microwave plasma is generated inside the chamber 6. The preferred frequency of microwave excitation is 2.45 GHz with a power output of from about 150 to about 350 watts. Microwave plasmas offer excellent performance at pressures up to 300 torr.

Figure 5:
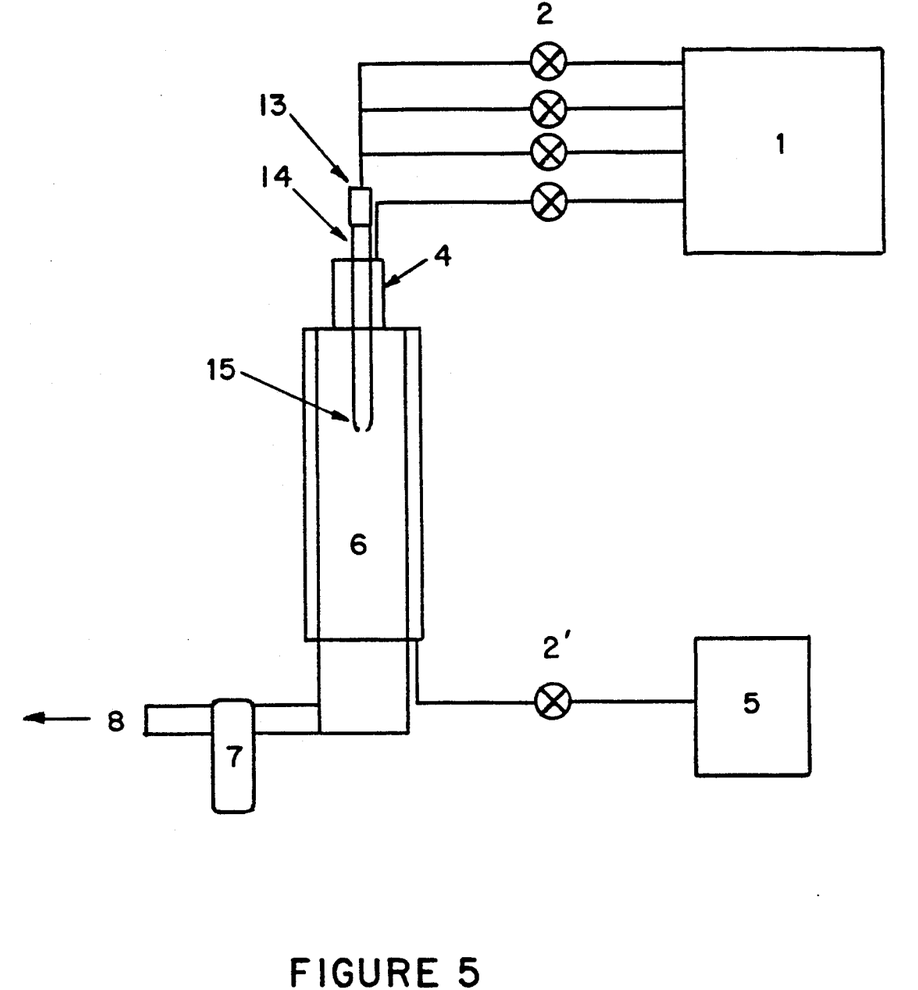
FIG. 5 is a view illustrating an apparatus whereby diamond particles can nucleate and/or grow by combustion. The combustion may be plasma excited by DC, RF or microwave fields.

FIG. 5 shows a diagrammatic view of the apparatus for nucleation and/or growth of diamond particles by combustion. A combustible mixture of process gases 1 are metered by mass flow controllers 2 through one or more flashback arrestors 13. The lance is now a burner 14 surrounded by a concentric shroud gas injected at 4. The burner tip 15 may have a number of orifice diameters and geometries. The burner tip sustains a flame inside the reaction chamber 6. A coolant gas such as nitrogen 5 is metered by a valve 2' and passed along the outside of the reaction chamber 6. Particles formed in the gas phase are extracted from the effluent gas by a particle filter 7 which leads to a vacuum pump connected to 8. External electromagnetic excitation fields may be impressed upon the flame produced by combustion. The inventors have observed excellent results by performing combustion which is plasma assisted by microwave excitation.

Other methods of external gas excitation are not illustrated, but still fall into the spirit of this invention. Thermal energy can be supplied by a hot wall furnace which surrounds the reaction chamber. The furnace can effect pyrolysis to create seeds, or can be used in conjunction with other excitation methods to produce nucleation or growth. Gases can also be activated by coming in contact with thermionic emitter materials heated to 2600° C. It has been previously demonstrated that diamond will deposit onto suitable substrates by passing certain gas mixtures past heated thermionic materials. Examples of suitable materials are refractory metals including Re, W and Ta, as well as refractory carbide materials including WC and TaC. The thermionic emitter materials can be arrayed as filaments, screens, tubes, or sheets, and can be heated by RF inductive coupling, radiant heating or by electric current flow.

Figure 6:
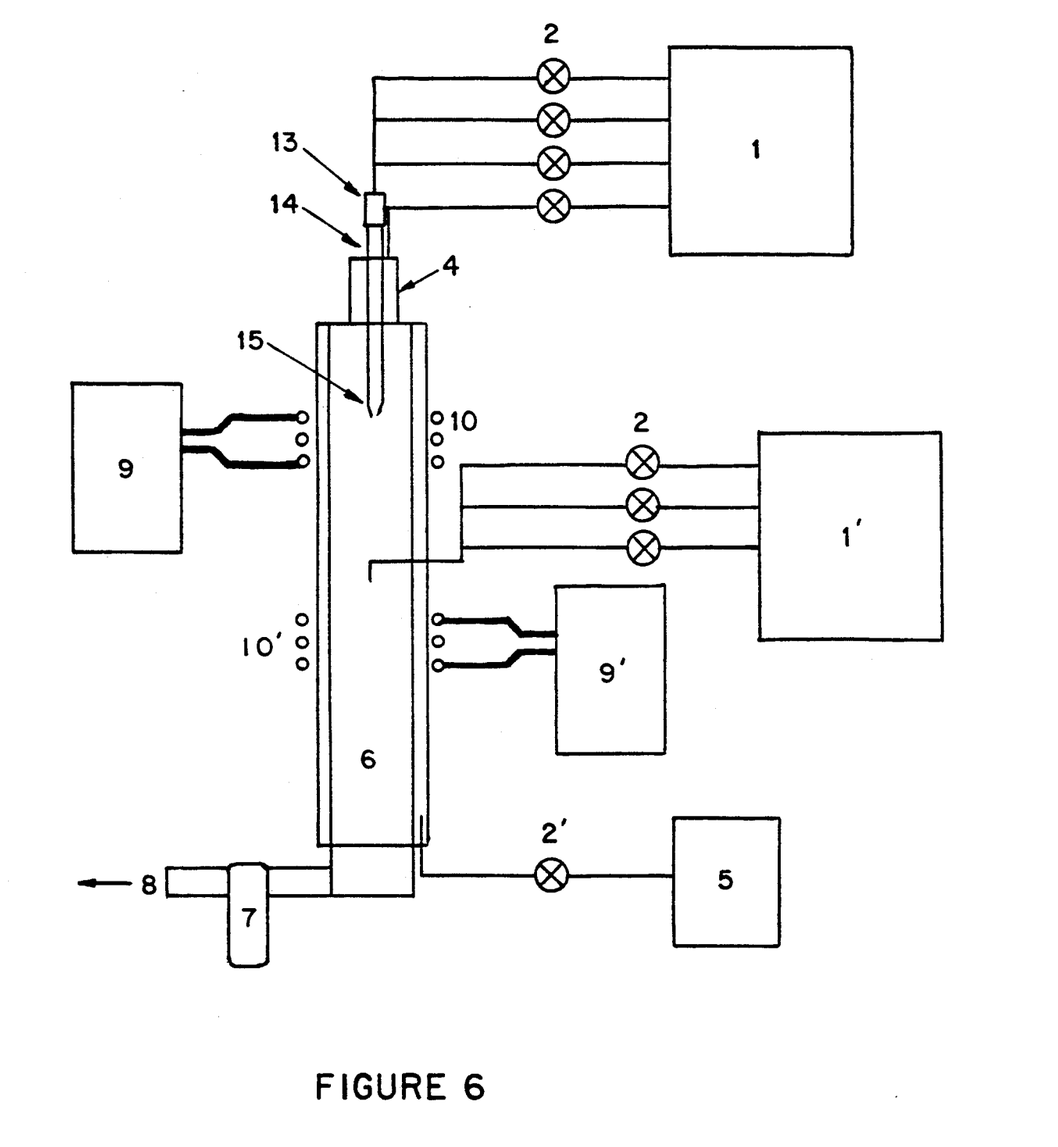
FIG. 6 is a view illustrating an apparatus employing separate, tandem stages for particle nucleation and particle growth.

FIG. 6 shows a diagrammatic view of an example apparatus for the production of diamond particles of controlled size and purity. The apparatus is a two stage reactor where the nucleation stage is separate from the particle growth stage. Note that gas mixtures are injected into each stage separately. The tandem reactor is positioned with the reaction chamber 6 vertical, so that particles nucleate at the top zone and particles grow at the bottom zone. Process gases to effect homogeneous nucleation 1 are metered by mass flow controllers 2 through flashback arrestors 13 into a burner 14. The process gases are surrounded by a concentric shroud gas injected at 4. A flame is sustained from a burner tip 15. The flame is plasma excited by an inductively coupled RF field applied by the powder supply 9 and the induction coils 10. Seeds fall from the nucleation stage down to the growth stage the force of gravity and the flow of gases. Process gases to effect particle growth 1' are injected into the chamber 6 beneath the nucleation zone and above the growth zone. RF plasma activation of the growth zone is provided by power supply 9' and induction coils 10'. A coolant gas such as nitrogen 5 is metered by a valve 2' and passed along the outside of the reaction chamber 6. The double walls of chamber 6 must be transparent to RF fields. Particles formed in the gas phase are extracted from the effluent gas by a particle filter 7 which leads to a vacuum pump connected to 8.

FIG. 6 is but one example of a multi-stage diamond powder reactor. Many other reactor designs are possible and are covered in the scope of this invention. For the apparatus of FIG. 6, RF plasma excitation was arbitrarily selected as the activation method for both the nucleation and the growth stages. However, there are numerous possible combinations of activation stages. The particle nucleation stage, as well as the particle growth stage, can be comprised of: DC plasma, RF plasma, microwave plasma, combustion (including plasma assisted combustion), hot wall furnace, and hot thermionic emitter material. FIG. 6 also arbitrarily selected only two gas activation zones although three or more activation zones could be employed. The gas flow pattern of the apparatus in FIG. 6 was selected as running from top to bottom, however, gases could also flow vertically, or the reactor could be horizontal or tilted. The process yield of this design can be improved by recycling unreacted process gases. Diamond particles are extracted from the effluent gas stream, and then the effluent gases are re-injected back into the reactor in order to fully expend the inputted gases. Alternatively, the seeds and particles can be recycled back into the nucleation and growth zones until the particles are ripened to the desired diameter, or have the desired bulk composition and surface composition/properties. The particles may then be extracted from the gas stream when desired.

An important feature of the method according to the present invention is the ability to add dopant gases into the nucleation stage and/or growth stage of the tandem reactor. To grow boron-doped diamond, for example, small amounts of boron-containing gases such as diborane and boron trichloride can be added. Boron-doped diamond is a p-type semiconductor, whose electrical conductivity is proportional to the concentration of boron in the diamond. To grow titanium-doped diamond, Ti-containing gases such as titanium tetrachloride can be added.

The production of silicon-containing diamond, silicon-containing diamond-like carbon, or SiC seeds can be effected in a number of ways. These are excellent seeds for diamond particle growth because of their high yield and excellent particle size uniformity. Nucleation of these seeds is accomplished by utilizing a source gas which is preferably a mixture of a silicon-containing gas/vapor, a hydrocarbon or halogenated-hydrocarbon gas/vapor and a diluent gas such as argon, neon, helium, hydrogen, or mixtures thereof; the silicon-containing gas/vapor is preferably silane, disilane, dichlorosilane, silicon tetrachloride, methylsilane or methyltrichlorosilane, the hydrocarbon gas/vapor is preferably methane, ethane, propane, ethylene, acetylene; and the chlorohydrocarbon can be carbon tetrachloride, dichloromethane, or trichloroethylene.

The present invention offers great flexibility in controlling the purity of the diamond powder as well as its mean particle size, particle size distribution, electrical resistivity and surface properties. This invention encompasses the following types of diamond particles, all of which are produced in the gas phase without any substrate: (1) single phase, ultrahigh purity diamond or diamond-like particles; (2) single phase diamond or diamond-like particles intentionally doped with elements such as boron, titanium, or silicon; (3) multi-phase particles composed of two or more concentric phases, one of which is diamond or diamond-like. Preferred example of other phases include silicon carbide, titanium carbide, and boron carbide.

Utilizing the apparatus described previously, the present invention can produce submicron diamond particles of controlled purity, including ultra-high purity. By "highly pure diamond" is meant a diamond particle which has less than 0.1 weight percent of elements other than carbon. Such high purity diamond powder cannot be economically mass produced by known high temperature/high pressure or shock processes presently described in the literature. The present invention is also deemed superior to the two step process of diamond chemical vapor deposition/ion beam deposition on a surface, followed by particle extraction off the substrate. An additional advantage of the present invention is it can synthesize diamond powder which is approximately monosized, eliminating an expensive size classification step.

Research in the synthesis of diamond powder from the vapor phase has focused on the suppression of $sp^2$-bonded carbon (e.g. graphite and carbynes) and the enhancement of $sp^3$ bonded carbon (e.g. diamond and diamond-like carbon). Diamond powders, both pure and doped with impurities, have been created using the apparatus described previously by activation of a mixture of gases emerging from a tube or nozzle into an evacuated chamber. The activation zone for homogeneous nucleation can also be employed as the same environment to support diamond growth on the seeds, but does not need to be.

The first step of particle formation is the homogeneous precipitation of seeds under 50 nm in diameter. These seeds must support the growth of diamond onto their surfaces in a subsequent step. (Diamond growth may occur in a region separate from nucleation or in the same environment.) Suitable seeds include pure diamond, pure diamond-like carbon, silicon carbide, boron carbide, and diamond or diamond-like carbon doped with B, Si or Ti.

As discussed previously, the present invention provides a method for homogeneously precipitating seeds composed of pure $sp^3$ carbon (i.e. diamond or DLC) which comprises: (a) injection of a gas mixture comprised of hydrocarbon gases, a halogenated-hydrocarbon gas, an inert gas, hydrogen and/or oxygen from a gas injection lance into a chamber which is evacuated or held at atmospheric pressure; and (b) activation of the gas mixture by an externally applied electric field such as a DC, RF or microwave field, by a hot wall furnace, by combustion, and/or by a sufficiently hot thermionic material.

The invention also includes a method for homogeneously precipitating seeds other than pure diamond or DLC which support the growth of diamond or diamond-like carbon. Suitable seeds compositions include silicon-containing diamond, silicon-containing diamond-like carbon, silicon carbide (SiC), silicon, boron-containing diamond, boron-containing diamond-like carbon, boron, or boron carbide. Methods for precipitating such seeds include: (a) injection of a gas mixture comprised of hydrocarbon gases, a halogenated-hydrocarbon gas, a silicon-containing gas, a boron-containing gas an inert gas, and/or hydrogen from a gas injection lance into a chamber which is evacuated or held at atmospheric pressure; and (b) activation of the gas mixture by an externally applied electric field such as a DC, RF or microwave field, by a hot wall furnace, by combustion, and/or by a sufficiently hot refractory material.

The second step is growth of diamond onto the seeds. The growth step controllably increases the diameter of the particles from the seed size to a desired diameter which may exceed 1 μm. If the seeds are of uniform size, growth of diamond particles can occur evenly to produce particles of uniform size. Diamond growth can be performed (a) in the same location as seeds precipitation, or (b) in a separate location from the nucleation region. In the latter case, the chemical environment in the growth region can be different than the environment in the nucleation region. During growth, diamond condenses from an activated gas mixture onto the surface of a seed and envelops the seed. Diamond growth is promoted by the high specific surface area of the seeds, and the crystal structure/surface chemical bonding of the seeds which supports the deposition of $sp^3$ bonded carbon. The present invention provides a further method for growth of $sp^3$ carbon (i.e. diamond or DLC) of controlled purity which comprises: (a) injecting the seeds into a gas mixture comprised of hydrocarbon gases, a halogenated-hydrocarbon gas, a silicon-containing gas, plus a boron-containing gas, an inert gas, and/or hydrogen from a gas injection lance into a chamber which is evacuated or held at atmospheric pressure; and (b) activating the gas mixture by an externally applied electric field such as a DC, RF or microwave field, by a hot wall furnace, by combustion, and/or by a sufficiently hot refractory material.

For the nucleation and growth steps, a wide variety of specific gases can be employed; hydrocarbon gases shown to produce diamond nucleation and growth include methane, ethane and acetylene; halogenated-hydrocarbon gases shown to produce diamond nucleation and growth include dichloromethane and trichloroethylene; and oxygen-containing gases include alcohols, aldehydes and ketones. Oxygen-containing gases/vapors can be added to modify the chemistry of plasmas, or can act as an oxidant for combustion. Molecular oxygen is the preferred oxidant, especially for combustion. Precipitation of silicon-containing seeds can be achieved by the addition of silicon-containing gases such as silane, disilane, dichlorosilane or silicon tetrachloride. Silicon carbide seeds can be created by the pyrolysis of methylsilane or methyltrichlorosilane. Methylsilane or methyltrichlorosilane can be pyrolyzed into SiC by simple heating by a furnace. Mixtures of the aforementioned gases can precipitate diamond by external activation by electromagnetic fields, or by pyrolysis initiated by externally applied heat, or by spontaneous combustion in the presence of an oxidant.

Diamond can nucleate and grow by combustion or by plasma-assisted combustion. The source of electromagnetic excitation can be DC, RF or microwave fields. The carbon-containing gas (fuel) is preferably combusted by molecular oxygen.

Now the present invention will be described in detail with reference to the examples. However, it should be understood that the present invention is by no means restricted by these specific examples.

EXAMPLE 1

Production of High Purity Diamond Particles

By use of the apparatus schematically shown in FIG. 4, pure diamond was grown from the combustion of acetylene by oxygen in a microwave cavity. 50 sccm of acetylene and 50 sccm of oxygen were pre-mixed and fed in from a fused silica tube. The opening of the fused silica tube was 2 mm within the microwave cavity. A flame was seen to propagate inside the microwave cavity even in the absence of microwave excitation. The total pressure was maintained at 20 torr by the use of an automatic throttle valve and the 2.45 GHz microwave energy was incident at 300 W power. The combustion flame emanating from the fused silica tube was enveloped by a curtain of 300 sccm of argon which shielded the flame from the inside wall of the fused silica tube. The precipitates were extracted from the effluent gas stream by filter paper.

The reaction product was found to be primarily a mixture of submicron diamond powder, carbynes, and graphite. The diamond powder was separated from the other forms of carbon by a 70% perchloric acid etch at 180° C. The residue was then centrifuged at 8650 rpm and then acid etched to remove other possible impurities. The resultant powder was analyzed by transmission electron microscopy, selected area electron diffraction, and Raman spectroscopy. Raman spectroscopy indicated the presence of diamond by the appearance of the 1332 cm$^{-1}$ peak which is characteristic of cubic (3C) diamond. Transmission electron microscopy indicated that many of the diamond particles were hexagonal in shape and had diameters below 0.5 um. Selected area electron diffraction of these isolated diamond crystals demonstrated the hexagonal shaped particles were monocrystalline, viz., a rare hexagonal form of diamond predominantly of the polytype 6H. 2H hexagonal diamond, also known as lonsdaleite, as well as 3C cubic diamond were also identified in the diamond product. The euhedral shape of the diamond particles, and their mode of collection, and their high chemical purity and their monocrystalline structure all indicate that the particles were homogeneously nucleated.

EXAMPLE 2

Synthesis of Silicon-Containing Diamond-Like Seeds.

The apparatus shown in FIG. 2 was fed with the source gases 5 sccm silane and 50 sccm acetylene at a total pressure of 30 torr. 300 sccm of argon was used as the shroud gas. The gas mixture was excited with a 300 watt microwave field. An extremely high yield of solid precipitated from the excited gas mixture. The diamond-like powder was separated from the other forms of carbon by 70% perchloric acid etch at 180° C. The residue was then centrifuged at 8650 rpm and then acid etched to remove other possible impurities. The resultant powder was analyzed by transmission electron microscopy, selected area electron diffraction, and Raman spectroscopy. Transmission electron microscopy of these particles reveals them to have a mean particle size of only 10 nm. No electron diffraction pattern could be obtained from these particles.

The yield of these silicon-containing diamond-like particles is significantly greater than the yield of pure diamond or diamond-like particles. The particle size uniformity of the silicon-containing diamond-like particles is also superior to the particle size uniformity of pure diamond or diamond-like particles. Previous work by the inventors has demonstrated that diamond-like carbon and silicon carbide are both excellent substrates for the growth of diamond thin films by activated CVD. Therefore, the silicon-containing particles are excellent seeds for the growth of pure or doped diamond or diamond-like particles.

A number of additional experiments were performed utilizing the apparatus as previously described. As before, the reaction gases were metered into the system through mass flow controllers, mixed before entering the reaction tube, and evacuated by a mechanical pump, and the system pressure was maintained at 10 to 70 torr by a throttle valve downstream from the reaction tube. The microwave generator operated at a frequency of 2.45 GHz with a power output from 200 to 300 W. The reactor was cooled by flowing nitrogen along the outside of the silica tube.

A variety of hydrocarbon feeds, diluted in argon, hydrogen or oxygen gas mixtures, were tested during the course of these additional experiments. Under the plasma conditions of these additional experiments, the best results on diamond particle formation were obtained with mixtures of dichloromethane and oxygen, which consistently yielded material that survived the wet chemical oxidation.

These additional experiments generally began by initiating an argon plasma discharge at approximately 10 torr pressure and 300 watts microwave power. The pressure was allowed to rise to about 20 or 30 torr whereupon the dichloromethane-oxygen mixture was injected through a fused silica lance whose tip was placed even with the top of the wave guide. A blue conical flame was generally seen burning at the lance tip and extending into the waveguide region. Final adjustments to the microwave tuning and the dichloromethane-to-oxygen flow rate ratio were made, and in some experiments the argon flow was shut off at this time. At a fixed oxygen flow rate, the flow rate of dichloromethane was raised until the onset of graphite deposition occurred in the microwave region, and then its flow rate was slightly decreased until the deposited graphite disappeared. The operating conditions of these experiments were as follows: (a) dichloromethane/oxygen runs were performed with flow rates of 120 and 100 sccm, respectively, and an initial reaction pressure of 20 torr; (b) in the experiments with "shielding" argon the flow rates were 200–240, 100–200 and 300–400 sccm for dichloromethane, oxygen, and argon, respectively, with a 30 torr starting reaction pressure. Under these conditions the residence time in the microwave zone was on the order of a second. The produced particles were collected downstream of the reaction tube on an ordinary laboratory filter paper which, as the experimental run progressed, began to clog, leading to an increase in the reactor pressure. The experiments were usually halted when the pressure reached about 70 torr. The collected deposits, supported by a carbon film on a copper grid, were analyzed, subsequently, and the samples were then oxidized to remove the non-diamond materials. The final residue, consisting of a cottony white powder, showed at 1000X magnification, discrete particles with the high reflectance characteristics of diamond. The largest particles observed were about 0.2 $\mu$m, whereas most of the particles were on the order of 50 nm in diameter.

The diamond particles described in this invention can be utilized in a wide variety of technological applications. For example, polishing of high purity glass for optical components (e.g. lenses, mirrors, fiber optic junctions) requires high purity diamond particles of a desired mean size (typically below 1 $\mu$m in diameter) and a very narrow particle size distribution, e.g., a standard deviation particle size less than 30% of the mean. This invention describes methods to produce such high purity particles directly from the gas phase, without expensive comminution or size segregation steps. Doped, semiconducting diamond particles could be used to engineer the surface chemistry/colloid chemistry of the diamond in various solvents. Diamond particles of controlled purity could be used as a filler material in various composite materials, in paints, or cements. The diamond and diamond-like particles of the present invention can be utilized in a wider variety of applications than conventional, synthetic diamond particles.

From the foregoing description, one skilled in the art can easily ascertain the essential characteristics of our invention and without departing from the spirit and scope thereof, can me various changes and/or modifications to the invention for adapting it to various usages and conditions. Accordingly, such changes and modifications are properly intended to be within the full range of equivalents of the following claims.

Having thus described our invention and the manner and process of making and using it in such full, clear, concise and exact terms as to enable any person skilled in the art to which it pertains, or with which it is most closely connected, to make and use the same, and having set forth the best modes for carrying out our invention.

What is claimed is:

1. A method for the synthesis of diamond or diamond-like carbon particles directly in the gas phase through homogeneous nucleation independent of any surface which comprises:
   providing a reaction vessel for containment of reaction gases;
   homogeneously precipitating a diamond or diamond-like growth seed from a gas phase in said reaction vessel;
   depositing diamond or diamond-like carbon from a second gas phase about said seed to produce diamond or diamond-like particles in said reaction vessel; and
   removing said particles from said vessel.

2. A method for the synthesis of diamond or diamond-like carbon particles directly in the gas phase through homogeneous nucleation independent of any surface which comprises:
   providing a reaction vessel having a nucleation zone and a growth zone;
   precipitating a diamond or diamond-like growth seed from a first gas phase in said nucleation zone;
   depositing diamond or diamond-like carbon from a second gas phase about said seed in said growth zone to form a diamond or diamond-like particle; and
   removing the diamond or diamond-like particle from the reaction vessel.

3. A method according to claim 2 wherein the nucleation zone and the reaction zone are the same zone.

4. A method according to claim 2 which further comprises adding a nucleating stimulant to the nucleation zone in the reaction vessel.

5. A method according to claim 4 wherein said nucleating stimulant is taken from the group consisting boron, silicon, and titanium containing gases and mixtures thereof.

6. A method according to claim 2 wherein the particles comprise crystalline diamond, non-crystalline diamond-like carbon, cubic 3C diamond, hexagonal 6H diamond, and hexagonal 2H diamond.

7. A method for the synthesis of diamond or diamond-like carbon particles directly in the gas phase through homogeneous nucleation independent of any surface which comprises:
   providing a reaction vessel having a nucleation zone and a growth zone which may be the same or different;
   adding a gas mixture comprising hydrocarbon gases, a halogenated-hydrocarbon gas, an inert gas, and hydrogen into said reaction vessel;
   activating the gas mixture in said vessel and thereby homogeneously precipitating a diamond or diamond-like growth seed;
   depositing diamond or diamond-like carbon from a second gas mixture about said seed in said growth zone to form a diamond or diamond-like particle; and
   removing the diamond or diamond-like particle from the reaction vessel.

8. A method according to claim 7 wherein said activating comprises exposing the gas mixture to an externally applied activating energy field or heat.

* * * * *